(12) United States Patent
Bruder et al.

(10) Patent No.: US 12,045,991 B2
(45) Date of Patent: Jul. 23, 2024

(54) DETECTION OF DISCONTINUITIES IN BATTERY CELLS

(71) Applicant: GM GLOBAL TECHNOLOGY OPERATIONS LLC, Detroit, MI (US)

(72) Inventors: Dmitriy Bruder, Clinton Township, MI (US); Megan E. McGovern, Detroit, MI (US); Ratandeep Singh Kukreja, Warren, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 189 days.

(21) Appl. No.: 17/497,277

(22) Filed: Oct. 8, 2021

(65) Prior Publication Data

US 2023/0109910 A1 Apr. 13, 2023

(51) Int. Cl.
| | | |
|---|---|---|
| *G06T 7/11* | | (2017.01) |
| *B60L 3/00* | | (2019.01) |
| *G01R 31/392* | | (2019.01) |
| *G06T 7/00* | | (2017.01) |
| *G06T 7/174* | | (2017.01) |

(52) U.S. Cl.
CPC ............... *G06T 7/11* (2017.01); *B60L 3/0046* (2013.01); *G01R 31/392* (2019.01); *G06T 7/0004* (2013.01); *G06T 7/174* (2017.01)

(58) Field of Classification Search
CPC ......... G06T 7/11; G06T 7/0004; G06T 7/174; G06T 7/001; G06T 2207/30108; B60L 3/0046; G01R 31/392; Y02E 60/10
See application file for complete search history.

(56) References Cited

U.S. PATENT DOCUMENTS

| | | | | |
|---|---|---|---|---|
| 2005/0252545 | A1* | 11/2005 | Nowlan | H02S 50/10 |
| | | | | 136/290 |
| 2018/0123178 | A1* | 5/2018 | Yang | H01M 10/425 |
| 2018/0287219 | A1* | 10/2018 | Sood | H01M 10/0525 |
| 2019/0310211 | A1* | 10/2019 | Jerschow | G01R 33/5602 |
| 2020/0028146 | A1* | 1/2020 | Li | H01M 50/507 |

FOREIGN PATENT DOCUMENTS

CN 203337560 U * 12/2013 ............. G01N 21/25

* cited by examiner

*Primary Examiner* — Catherine T. Rastovski
*Assistant Examiner* — Lal C Mang
(74) *Attorney, Agent, or Firm* — CANTOR COLBURN LLP (57) ABSTRACT

A system for evaluating a battery cell includes an imaging device configured to take a first image of at least part of the battery cell when the battery cell is in a first deformation state, and take a second image of the at least part of the battery cell when the battery cell is in a second deformation state. The system also includes a processor configured to analyze the first image and the second image, identify a first region of the first image that represents a suspected discontinuity, the first region corresponding to a portion of the battery cell, compare the first region of the first image to a second region of the second image, the second region corresponding to the portion of the battery cell, and determine that the suspected discontinuity is an actual discontinuity based on a difference between the first region and the second region.

20 Claims, 12 Drawing Sheets

DETECTION OF DISCONTINUITIES IN BATTERY CELLS

INTRODUCTION

The subject disclosure relates to batteries, and more particularly to detecting discontinuities in battery cells.

Battery pouch cells are used in various applications, such as automotive applications (e.g., in electric and hybrid vehicles). Tears and other discontinuities can occur in parts of a battery cell, such as anode and cathode foils. Such discontinuities can result in short circuits and other malfunctions. Inspection of battery cells and their constituents is important in order to ensure proper function and detect discontinuities before they can negatively impact such cells.

SUMMARY

In one exemplary embodiment, a system for evaluating a battery cell includes an imaging device configured to take a first image of at least part of the battery cell when the battery cell is in a first deformation state, and take a second image of the at least part of the battery cell when the battery cell is in a second deformation state. The system also includes a processor configured to acquire the first image and the second image. The processor is configured to analyze the first image and the second image, and identify a first region of the first image that represents a suspected discontinuity, the first region corresponding to a portion of the battery cell. The processor is also configured to compare the first region of the first image to a second region of the second image, the second region corresponding to the portion of the battery cell, and determine that the suspected discontinuity is an actual discontinuity based on a difference between the first region and the second region.

In addition to one or more of the features described herein, the first image and the second image are acquired using direct x-ray radiography.

In addition to one or more of the features described herein, at least one of the first deformation state and the second deformation state is achieved by elastically deforming part of the battery cell.

In addition to one or more of the features described herein, at least one of the first deformation state and the second deformation state is achieved by bending a tab of the battery cell.

In addition to one or more of the features described herein, the battery cell is a pouch-type battery cell.

In addition to one or more of the features described herein, the portion of the battery cell includes at least one of: a foil of the battery cell, a foil stack of the battery cell, a weld region and a region including a weld line.

In addition to one or more of the features described herein, analyzing the first image and the second image is performed to increase at least one of a contrast and a visibility of the suspected discontinuity.

In addition to one or more of the features described herein, analyzing the first image and the second image includes performing at least one of digital filtering and histogram weighting.

In addition to one or more of the features described herein, identifying the first region is based on an automated machine vision discontinuity detection process.

In one exemplary embodiment, a method of evaluating a battery cell includes taking a first image of at least part of the battery cell when the battery cell is in a first deformation state, taking a second image of the at least part of the battery cell when the battery cell is in a second deformation state, analyzing the first image and the second image, and identifying a first region of the first image that represents a suspected discontinuity, the first region corresponding to a portion of the battery cell. The method also includes comparing the first region to a second region of the second image, the second region corresponding to the portion of the battery cell, and determining that the suspected discontinuity is an actual discontinuity based on a difference between the first region and the second region.

In addition to one or more of the features described herein, the first image and the second image are acquired using direct x-ray radiography.

In addition to one or more of the features described herein, at least one of the first deformation state and the second deformation state is achieved by elastically deforming part of the battery cell.

In addition to one or more of the features described herein, the battery cell is a pouch-type battery cell.

In addition to one or more of the features described herein, the second region also represents the suspected discontinuity, and comparing the first region to the second region includes comparing a geometry of the suspected discontinuity in the first region to a geometry of the suspected discontinuity in the second region.

In addition to one or more of the features described herein, determining that the suspected discontinuity is an actual discontinuity is based on the suspected discontinuity being visible in the first region of the first image, and the suspected discontinuity being not visible in the second region of the second image.

In addition to one or more of the features described herein, identifying the first region is based on an automated machine vision discontinuity detection process.

In one exemplary embodiment, a computer program product includes a computer readable storage medium, the computer readable storage medium having instructions executable by a computer processor to cause the computer processor to perform a method. The method includes taking a first image of at least part of the battery cell when the battery cell is in a first deformation state, taking a second image of the at least part of the battery cell when the battery cell is in a second deformation state, analyzing the first image and the second image, and identifying a first region of the first image that represents a suspected discontinuity, the first region corresponding to a portion of the battery cell. The method also includes comparing the first region to a second region of the second image, the second region corresponding to a portion of the battery cell, and determining that the suspected discontinuity is an actual discontinuity based on a difference between the first region and the second region.

In addition to one or more of the features described herein, at least one of the first deformation state and the second deformation state is achieved by elastically deforming part of the battery cell.

In addition to one or more of the features described herein, the battery cell is a pouch-type battery cell, and the portion of the battery cell includes at least one of: a foil of the battery cell, a foil stack of the battery cell, a weld region and a region including a weld line.

In addition to one or more of the features described herein, analyzing the first image and the second image is performed to increase at least one of a contrast and a visibility of the suspected discontinuity.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for evaluating battery cells and/or non-destructively detecting discontinuities in battery cells. Embodiments include a method of detecting discontinuities in a pouch-type battery cell or other type of battery cell based on images of the battery cell taken under various deformation states.

An embodiment of a method includes taking multiple images of a portion of a battery cell in multiple different deformation states. One or more images may be taken for each deformation state. For example, a first image of a portion of a battery cell is acquired when the battery cell is in a first deformation state, and a second image of the portion is acquired when the battery cell is in a second deformation state. Deformation states include, for example, a non-deformed state and various types and/or extents of deformation (e.g., an undeformed state, a state in which a battery tab is deformed to one extent, and a state in which the tab is deformed to another extent). In an embodiment, the images are taken using a tomography technique such as direct x-ray radiography.

The first and second images (and additional images if acquired) are optionally processed (e.g., to increase brightness, visibility, contrast, etc.) and then analyzed to identify a suspected discontinuity or discontinuities, such as a foil tear or fold. Regions of the images representing the suspected discontinuity are compared to determine whether there is a difference between them.

If the difference between a suspected discontinuity among the images is large enough (e.g., greater than a threshold difference), the method includes determining that the suspected discontinuity is an actual discontinuity. Additional actions may be performed in response to detecting an actual discontinuity, such as performing additional imaging and/or inspection, or taking remedial measures such as repair or replacement of the battery cell or parts thereof.

It is noted that a suspected discontinuity may not be readily discernable or visible in all of the deformation states. For example, the first image of the portion of the battery cell can show a discontinuity, while the second image does not show the discontinuity (i.e., the discontinuity is hidden). In this example, the comparison is between a location or region of the first image showing the suspected discontinuity, and a corresponding location or region in the second image (where the locations or regions of the two images show substantially the same portion of the battery cell).

Embodiments described herein present numerous advantages and technical effects. The embodiments provide for an improved evaluation method, which is able to detect discontinuities that are otherwise difficult to detect via other techniques. The embodiments also simplify evaluation by allowing for detection without the need to disassemble or tear down a battery cell.

Figure 1:
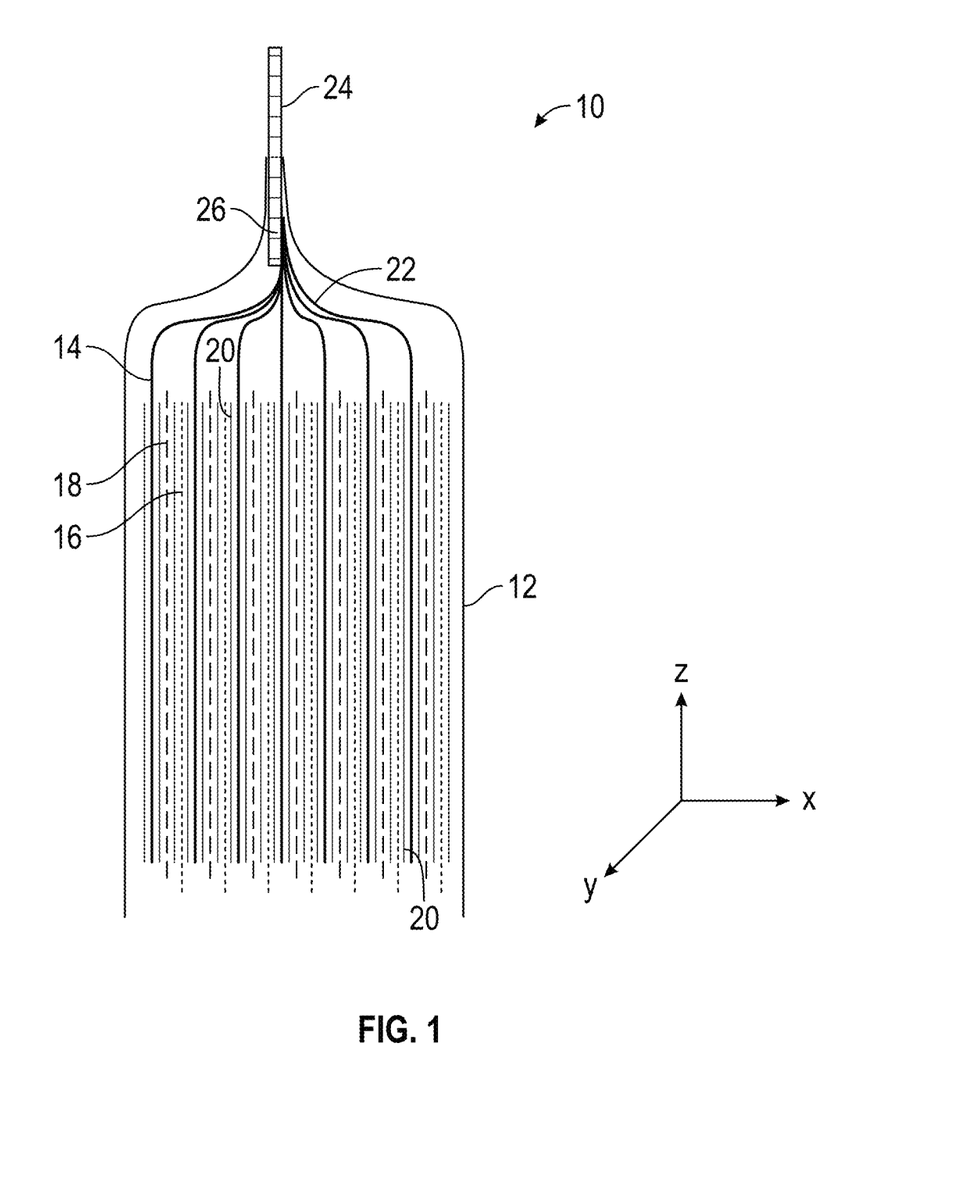
FIG. 1 depicts an example of a pouch-type battery cell.

FIG. 1 depicts an example of a pouch-type battery cell 10 that can be inspected or analyzed via the systems and methods described herein. It is noted that the systems and methods are not limited to the specific example of FIG. 1, or any other specific battery type.

The battery cell 10 includes a flexible envelope or pouch 12 that is sealed to enclose a plurality of stacked unit cells (cell stack). The pouch 12 may be an aluminum laminated foil or other suitable pouch material. Each unit cell includes a negative electrode or anode 14, and a positive electrode or cathode 16. The anodes and cathodes are made from selected electrically conductive materials and configured as thin sheets or foils. Each unit cell also includes a separator 18 made from an electrically insulating material such as a polymer or a ceramic. An active material 20 such as a Lithium material is disposed in the pouch 12 between the various layers of the unit cells.

As shown in FIG. 1, each anode 14 (also referred to as an anode foil) extends away from the unit cells, and the anode foils 14 are attached together as a foil stack 22. The foil stack 22 welds foils together by, for example, a primary ultrasonic weld. The foil stack 22 is in turn attached to an electrically conductive tab 24 via a weld 26. The weld 26 may be a solid-state weld joint formed through ultrasonic welding or a fusion weld joint formed through laser welding, although other metal-to-metal joining procedures may be used. The tab 24 in this example is a negative terminal tab. The cathode foils 16 may be similarly welded to a positive terminal tab (not shown) that extends to an exterior of the pouch 12.

Embodiments include a method of non-destructively detecting discontinuities and other defects in a pouch-type battery cell, such as the cell 10. The method includes imaging a portion of a battery cell in multiple deformation states and analyzing the resulting images to detect one or more discontinuities. For example, a first image is acquired when the battery cell is in a non-deformed state, and the first image is analyzed to identify potential tears or other discontinuities (also referred to as "suspected discontinuities"). The battery cell is put into a deformed state, in which a tab or other part of the battery cell is elastically deformed. When the battery cell is in the deformed state, a second image of the portion is acquired and analyzed. The images are compared to determine whether a tear or other discontinuity exists that should be addressed (an actual discontinuity).

The battery cell may be put into a deformed state by elastically deforming a component thereof via application of a selected amount and direction of force to the component. The force is applied such that the deformation is elastic and the component will return to its previous state upon removal of the force.

Figure 2:
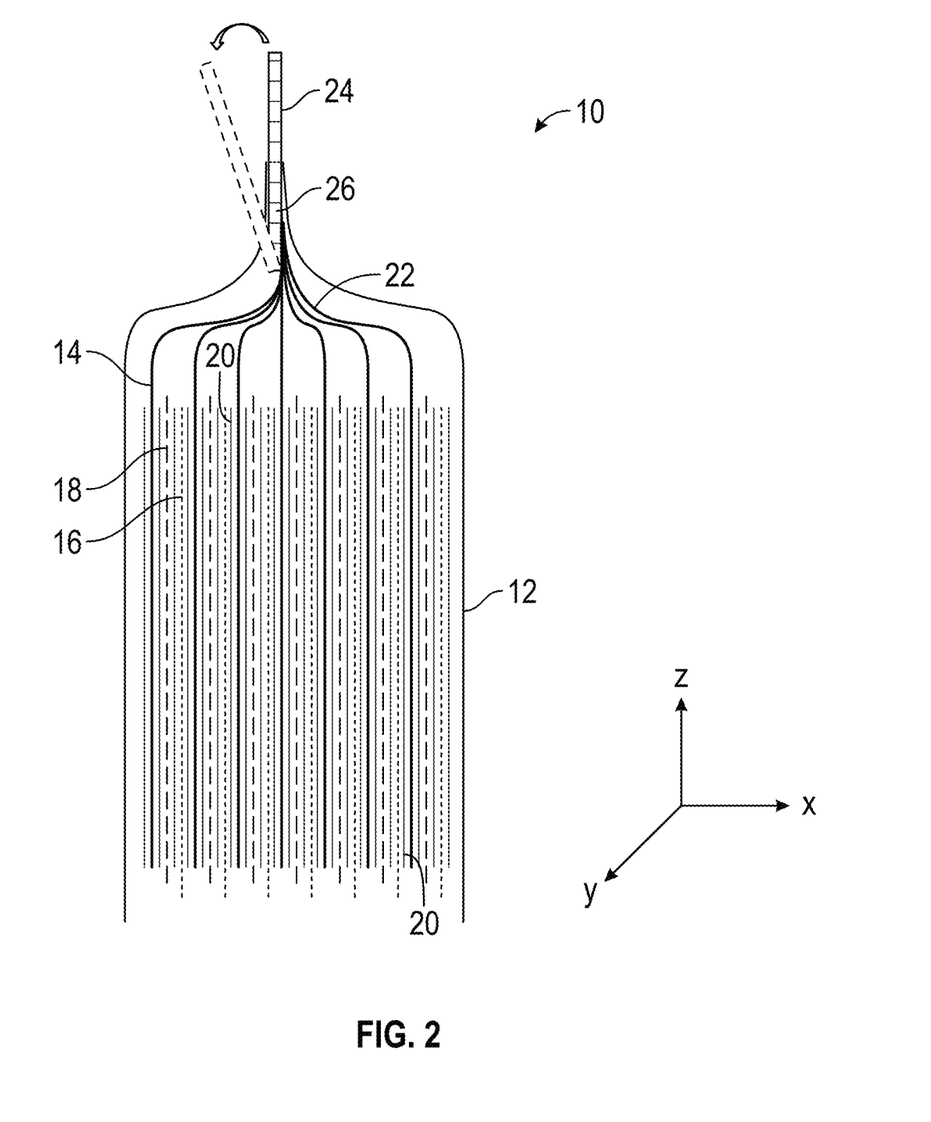
FIG. 2 depicts the battery cell of FIG. 1 in a deformed state.

In an embodiment, the battery cell 10 is deformed by bending, twisting, pulling or otherwise deforming tab 24. FIG. 2 depicts an example of such a deformation, in which the tab 24 is deformed by bending. The tab 24 may be bent so that the tab 24 extends in a direction that forms an angle relative to an undeformed axis of the tab 24 and/or battery cell 10 (e.g., the longitudinal axis of the cell or the z-axis shown in FIGS. 1 and 2). For example, the tab 24 may be bent by about 10 degrees.

It is noted that any desired component or part of a battery cell could be deformed. For example, the battery cell 10 can be put into a deformation state by applying force to the pouch material, a housing and/or by applying force to one or more foils (e.g., between a unit cell and the tab 24).

A battery cell such as the cell 10 may be imaged when in various deformation states according to any desired imaging technique. For example, battery cells can be imaged using tomography, such as x-ray radiography, magnetic resonance tomography, microwave tomography, neutron tomography and others. X-ray tomography includes direct radiography and x-ray computed tomography (CT). Other types of imaging that can be used include optical, radar, ultrasound imaging and others.

In an embodiment, battery cells are imaged using direct radiography, which is relatively fast while providing sufficient resolution for detecting discontinuities. X-ray CT tomography may be unsuitable due to resolution and cycle time constraints. Both x-ray CT and direct radiography (DR) are known to have difficulty in detecting discontinuities such as foil tears in battery cells, including tears at or near weld lines. Discontinuities due to cracks and tears in battery cell foils are difficult to detect due to relatively low changes in x-ray attenuation, between discontinuous and continuous regions. The use of direct radiography in conjunction with deformation and/or image processing as discussed further herein is effective in increasing the detectability of these discontinuities.

Acquired images may be post-processed according to one or more of various techniques in order to increase the contrast or visibility of suspected discontinuities, or otherwise make detection easier. Examples of post-processing techniques include digital filtering (e.g., Wallis Filter, Emboss Filter, Edge detection, etc.) and histogram weighting to increase discontinuity contrast. In some cases, post-processing may not be needed or desired, for example, if acquired images show discontinuities with sufficient contrast and visibility.

Subsequent to acquisition and/or image post-processing, images are analyzed to detect any suspected discontinuities, such as tears, folds, separation or other damage. This analysis may be automated. In an embodiment, image analysis is performed using one or more machine learning, artificial intelligence and/or machine vision methods. Examples of methods that can be used for discontinuity detection include object tracking, digital image correlation, neural networks, classifiers, supervised and unsupervised machine learning, image cross correlation, histogram of gradients and others. Any combination of the above techniques and methods may be employed.

Based on detecting one or more suspected discontinuities in one or more of the acquired images, the acquired images are compared to determine whether there is any change in the suspected discontinuities, or whether there is any change in the acquired images, as a result of the battery cell being in different deformation states. For example, a suspected discontinuity in a region of an image of the battery cell in one deformation state is compared to a corresponding region of another image of the battery cell in a different deformation state. If there is a difference and the difference is of a sufficient magnitude, the method includes determining that the suspected discontinuities are actual discontinuities. The difference may be a difference in size, length, width, shape or other geometry of a suspected discontinuity among different images. In some cases, the difference is between an image region in which a suspected discontinuity is visible and a corresponding region in another image in which the suspected discontinuity is not visible. For example, a suspected foil tear may be considered an actual foil tear if the difference in length and/or width of the tear between images is at or above a threshold, or if the tear shows up in one deformation state but is not visible in another deformation state. Comparison of images may include one or more of the above image processing techniques.

Figure 3A:
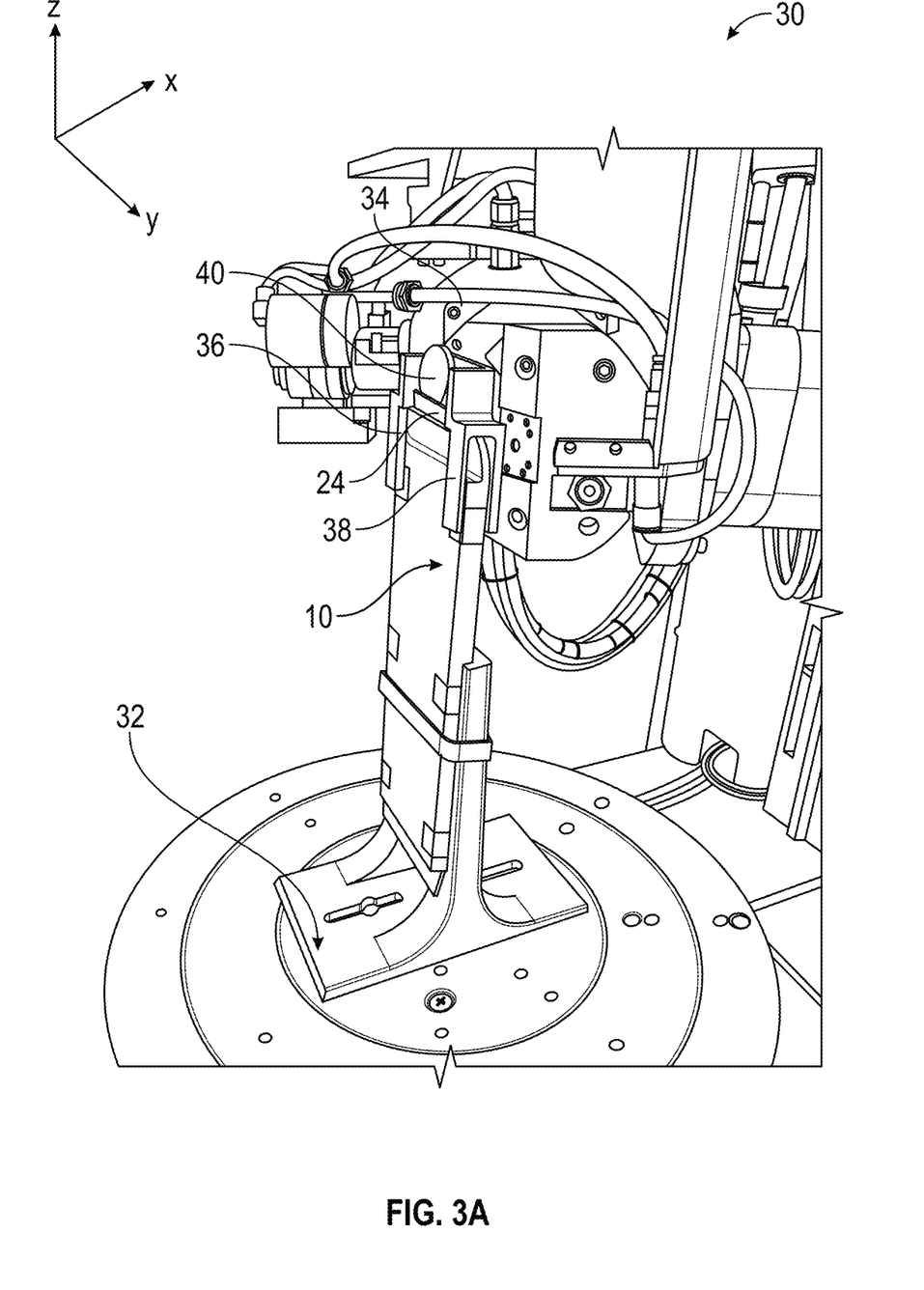
FIGS. 3A-3C depict an example of an imaging and deformation system for evaluating battery cells.
Figure 3B:
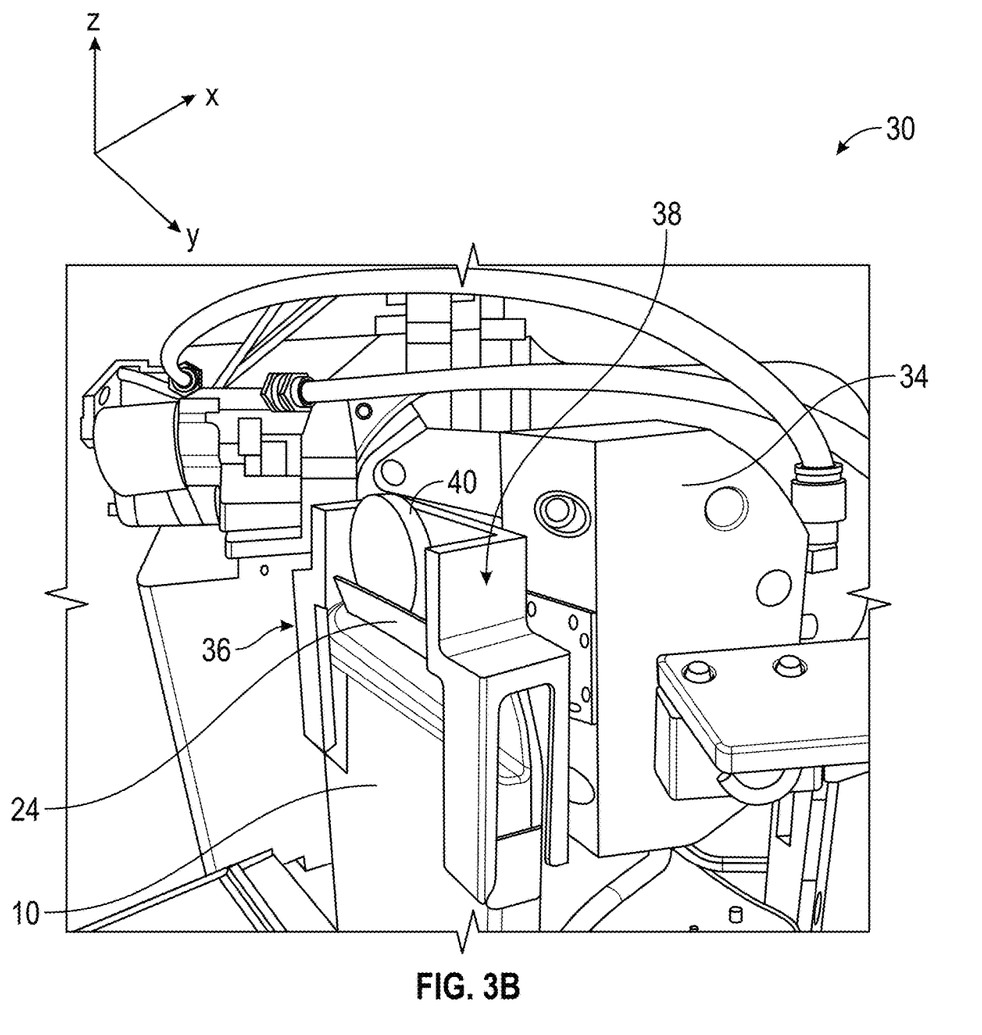
Figure 3C:
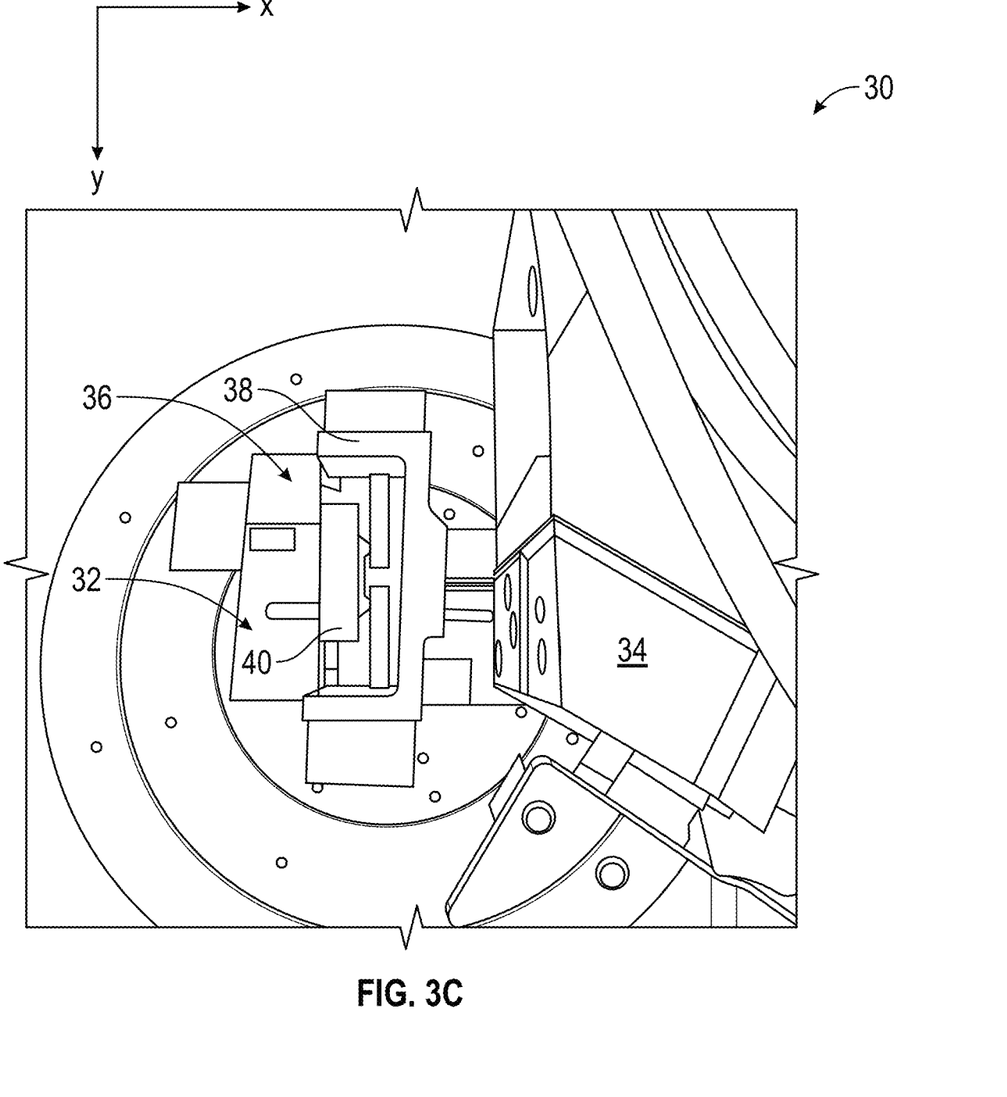

FIGS. 3A-3C depict an example of an imaging system 30 that may be used to perform various functions described herein. The imaging system 30 includes a support structure or holding fixture 32 for securing a battery cell (e.g., the battery cell 10) in a stationary position. An imaging assembly such as a direct x-ray tomography assembly 34 is positioned and oriented to image at least part of the battery cell, such as a portion of the cell that includes a foil stack, tab and weld. A deformation assembly 36 includes a support structure 38 and a deformation or bending feature such as a plastic disc 40 in connection with an actuator (not shown).

Figure 4:
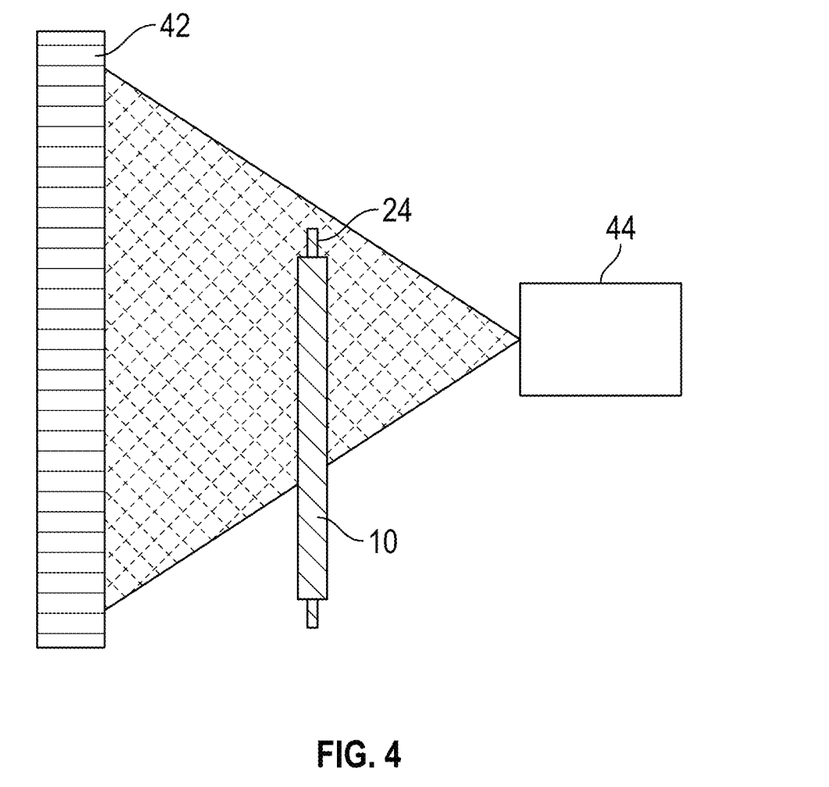
FIG. 4 depicts an x-ray source and a detector of the system of FIGS. 3A-3C.

As shown in FIG. 4, the tomography assembly 34 includes an x-ray source 44 and an x-ray detector 42. Images may be taken from the side of the battery cell 10 (e.g., the x-ray source is directed along the x-axis) as shown in FIG. 4, or may be taken from any desired direction and with any desired orientation.

Figure 5:
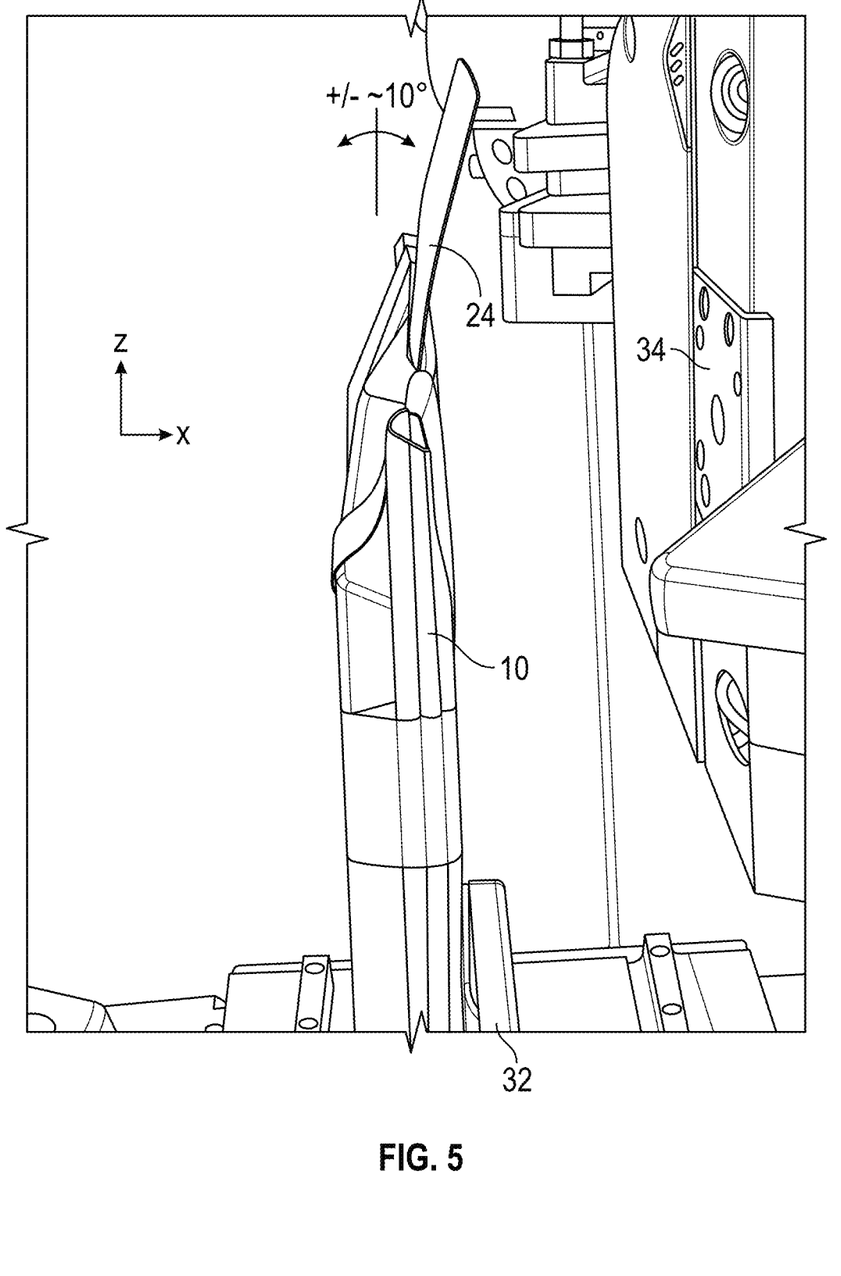
FIG. 5 depicts an example of a deformation of a battery cell.
Figure 6:
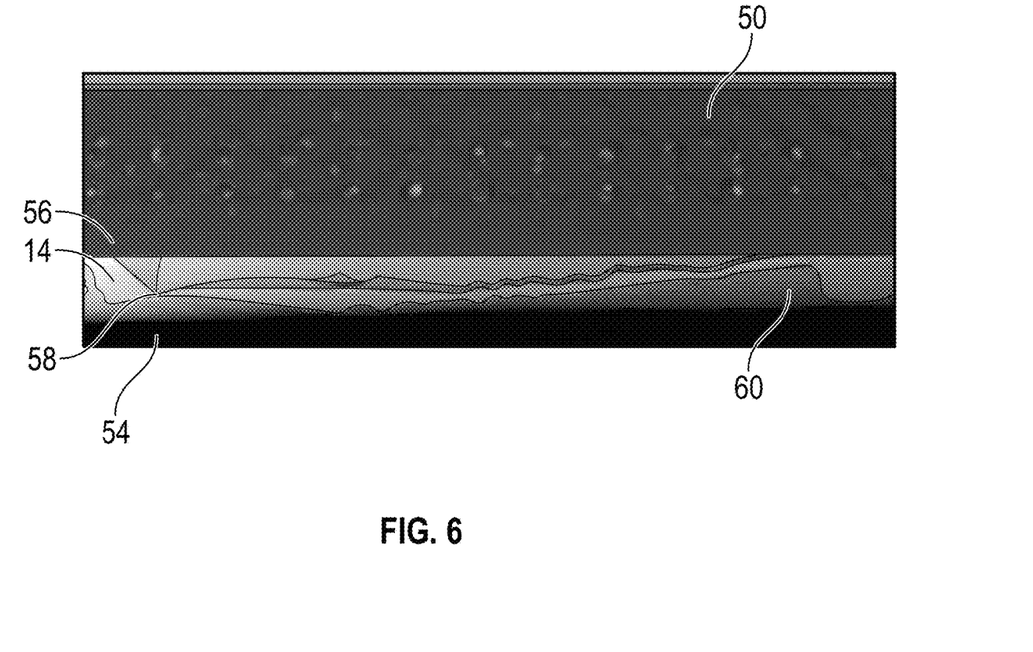
FIG. 6 depicts an example of an image of a portion of the battery cell of FIG. 5 when the battery cell is in a deformation state achieved by bending a tab of the battery cell.
Figure 7:
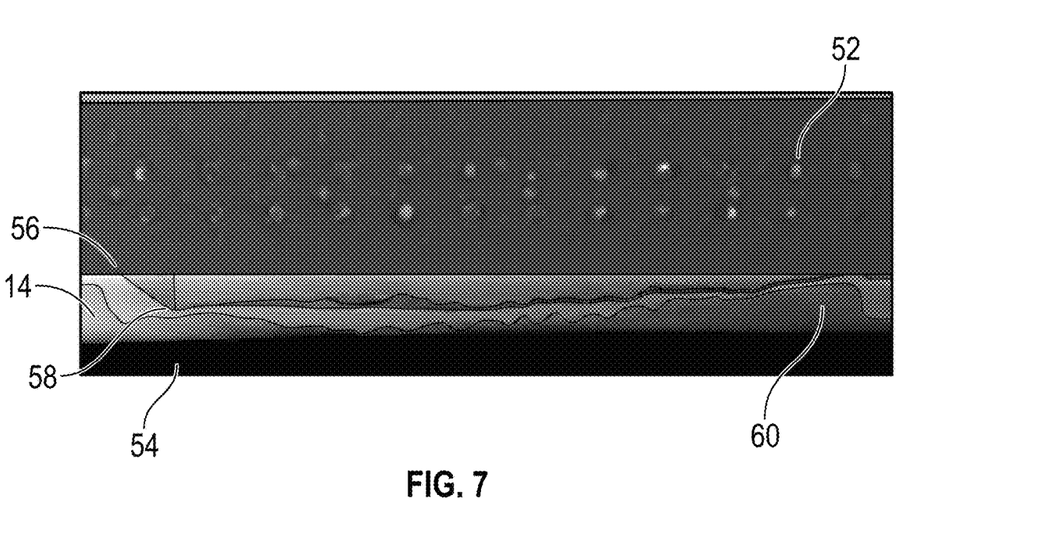
FIG. 7 depicts an example of an image of the portion of the battery cell of FIGS. 5 and 6 when the battery cell is in another deformation state achieved by bending the tab.

FIGS. 5-7 depict an example of deformation of a portion of the battery cell 10 and images of the battery cell 10 in different deformation states. The battery cell 10 is put into two deformation states and is imaged in each state. FIG. 5 shows an example of how the deformation states are achieved. In this example, the battery cell 10 is in a first deformation state in which the tab 24 is bent by an angle of about positive 10 degrees (+10°) with respect to the z-axis or longitudinal axis of the battery cell 10, and is in a second deformation state in which the tab 24 is bent by an angle of about negative 10 degrees (−10°).

FIG. 6 depicts a direct x-ray radiography image 50 (also referred to simply as an x-ray image) taken when the battery cell 10 was in the first deformation state (tab bent by +10°), and FIG. 7 depicts an x-ray image 52 taken when the battery cell 10 was in the second deformation state (tab bent by −10°). Each image depicts portions of the battery cell 10 including a portion of an electrode stack 54 (including various anode foil layers, cathode foil layers and separators), a portion of the anode foils 14, and a weld region 56 (formed by the weld 26).

Each image also shows discontinuities in the form of a suspected foil fold 58 and a suspected tear 60. As can be seen the suspected tear 60 has a different width when the tab is bent by +10° (FIG. 6) than when the tab is bent by −10° (FIG. 7). Based on this difference, the suspected tear 60 may be determined to be an actual tear.

Figure 8A:
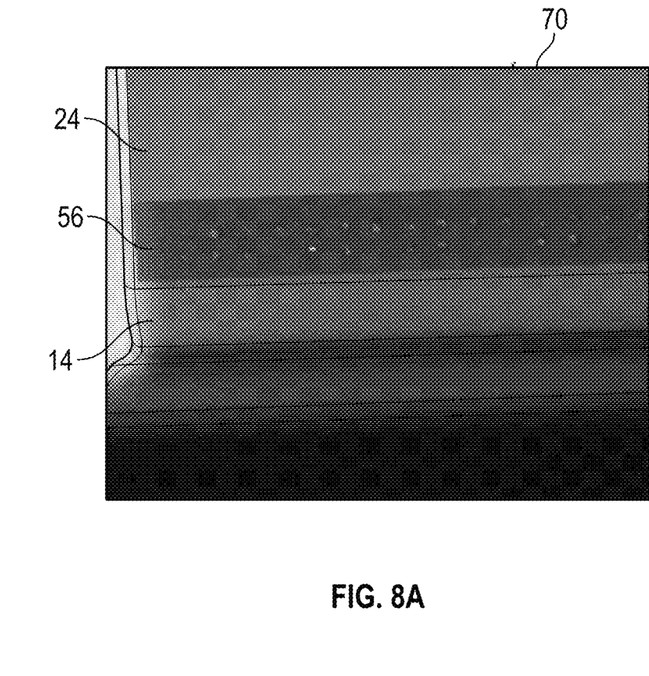
FIGS. 8A and 8B depict an example of an image of a portion of a battery cell in a deformed state, the image processed to increase the visibility of suspected discontinuities.
Figure 8B:
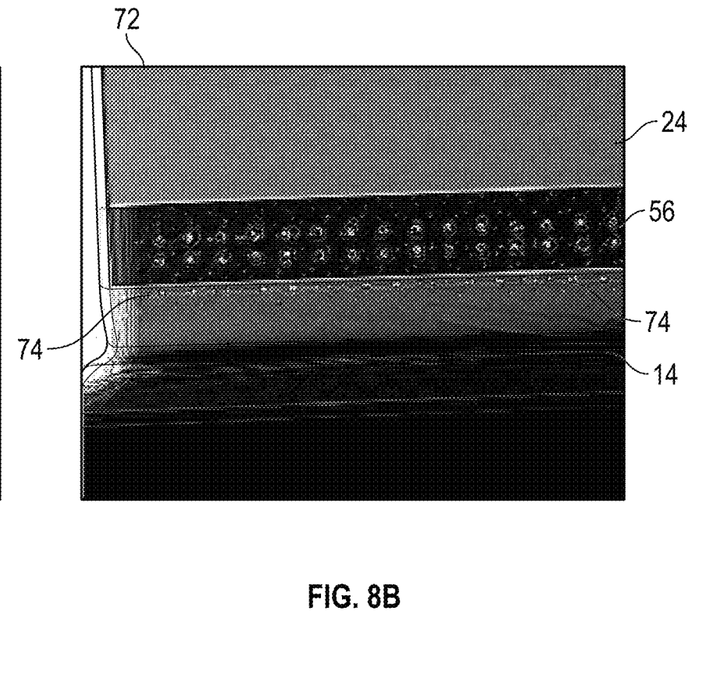

FIGS. 8A-8B are examples of radiographic images taken according to embodiments described herein. These examples illustrate how deformation and post-processing can enhance suspected discontinuities and make them easier to detect.

FIG. 8A shows an example of an image 70 of the battery cell 10 in a deformed state and prior to post-processing, and FIG. 8B shows an image 72 of the battery cell 10 when the battery cell in the deformed state after post-processing. In this example, the image 72 was filtered using a Wallis Filter and an Embossing Filter. As can be seen, bending and post-processing reveals a number of discontinuities 74 along a weld line at an edge of the weld region 56. Such internal discontinuities are not detectable via visual inspection or optical image, and are difficult to detect via radiography alone.

Figure 9:
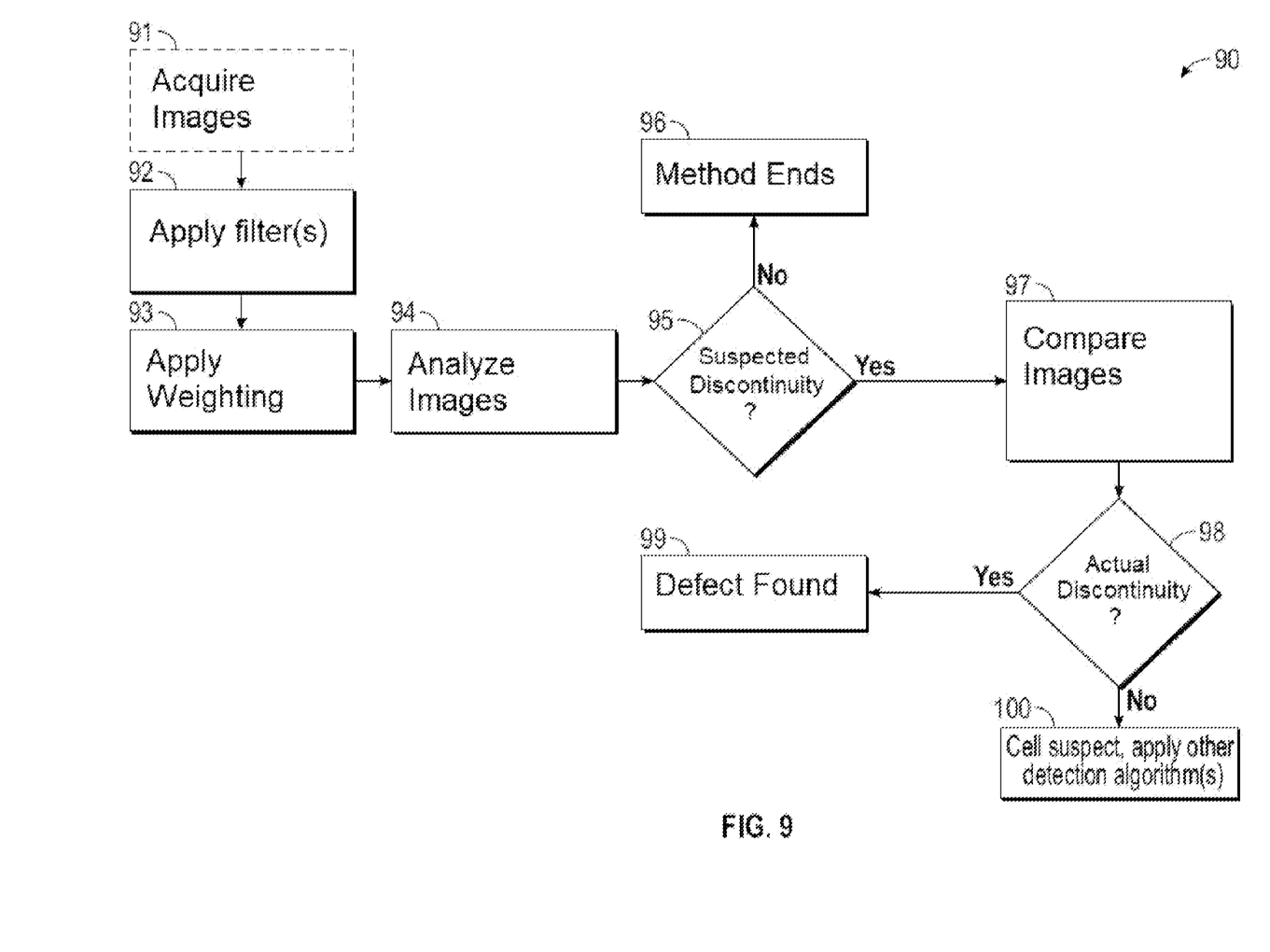
FIG. 9 is a flow diagram depicting aspects of a method of evaluating a battery cell and/or detecting discontinuities in a battery cell.

FIG. 9 illustrates an embodiment of a method 90 of evaluating a battery cell and/or detecting discontinuities. Aspects of the method 90 may be performed by a processor or processors. It is noted the method 90 may be performed by any suitable processing device or system, or combination of processing devices.

The method 90 includes a number of steps or stages represented by blocks 91-100. The method 90 is not limited to the number or order of steps therein, as some steps represented by blocks 91-100 may be performed in a different order than that described below, or fewer than all of the steps may be performed.

Aspects of the method are discussed in conjunction with the battery cell 10 in deformation states as shown in FIGS. 1 and 2, for illustration purposes. The method 90 is not so limited and can be used with any type of battery cell and with any number of different deformation states.

At block 91, images of a battery cell in different deformation states are acquired. The images may be taken via an x-ray radiography technique such as direct x-ray radiographic technique, or other suitable modality. Examples of other types of images include optical images, radar images, ultrasound images and others.

For example, a first image of the battery cell 10 is acquired in an undeformed state (shown in FIG. 1). A second image of the battery cell 10 is acquired in a deformed state in which the battery cell tab 24 has been bent or otherwise elastically deformed to a selected degree. Additional images in other deformation states may be acquired. The number of images that can be taken, as well as the number and type of deformation states, is not limited to the examples discussed herein.

The images may optionally be processed to increase visibility of suspected discontinuities and/or other features of the battery cell. For example, at block 92, one or more filters are applied, such as a Wallis filter and/or an embossing filter. In another example, at block 93, histogram weighting is applied to each image.

At block 94, the images are analyzed to search for any suspected discontinuities. Analysis may be performed via visual inspection of the images, and/or via machine learning techniques or other image analysis techniques. At block 95, it is determined whether any suspected discontinuities are detected. If not, the method completes (block 96).

At block 97, if one or more suspected discontinuities are detected, the first and second images are compared to determine whether there is a difference between the suspected discontinuities in the first image and the suspected discontinuities in the second image, or whether there is a difference between corresponding regions in the first image and the second image (e.g., if the suspected discontinuities are not visible in a given image). For example, an object tracking algorithm may be used to determine whether and to what extent there is expansion and contraction of a suspected tear between the images. Based on this comparison, it is determined whether the suspected discontinuities are actual discontinuities (block 98).

At block 99, if actual discontinuities are detected, they are classified as a defect. The battery cell 10 may then be replaced or repaired. At block 100, if the suspected discontinuities are not considered actual discontinuities, other detection algorithms or other inspection methods may be used to confirm whether the suspected discontinuities will have an adverse effect on battery operation or life.

Figure 10:
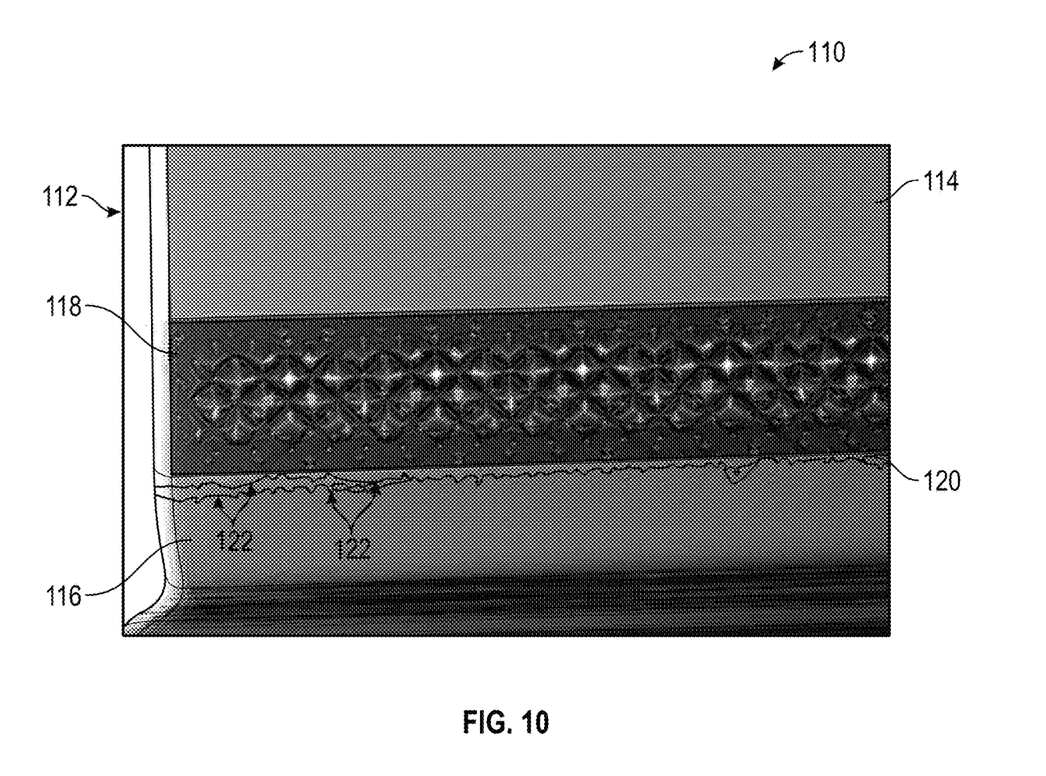
FIG. 10 depicts an example of an image of a portion of a battery cell used in the method of FIG. 9.

FIG. 10 shows an example of an image 110 taken of a portion of a battery cell 112. The battery cell 112 includes a tab 114, a foil stack 116, a weld region 118 and a weld line 120. The image 110 was taken using direct x-ray radiography under a deformed state in which the tab was bent by a selected angle (e.g., 10 degrees). The image 110 was also processed via filtering to increase the contrast and visibility of discontinuities. The image 110 shows multiple suspected discontinuities in the form of suspected tears 122. Additional images in various deformation states may be acquired, processed and compared according to the method 90 in order to determine whether one or more of the suspected tears are actual tears.

The systems and methods described herein may be applicable to various types of batteries. In an embodiment, battery cells evaluated may be cells used in electric and/or hybrid vehicles; however, the systems and methods are not so limited.

Figure 11:
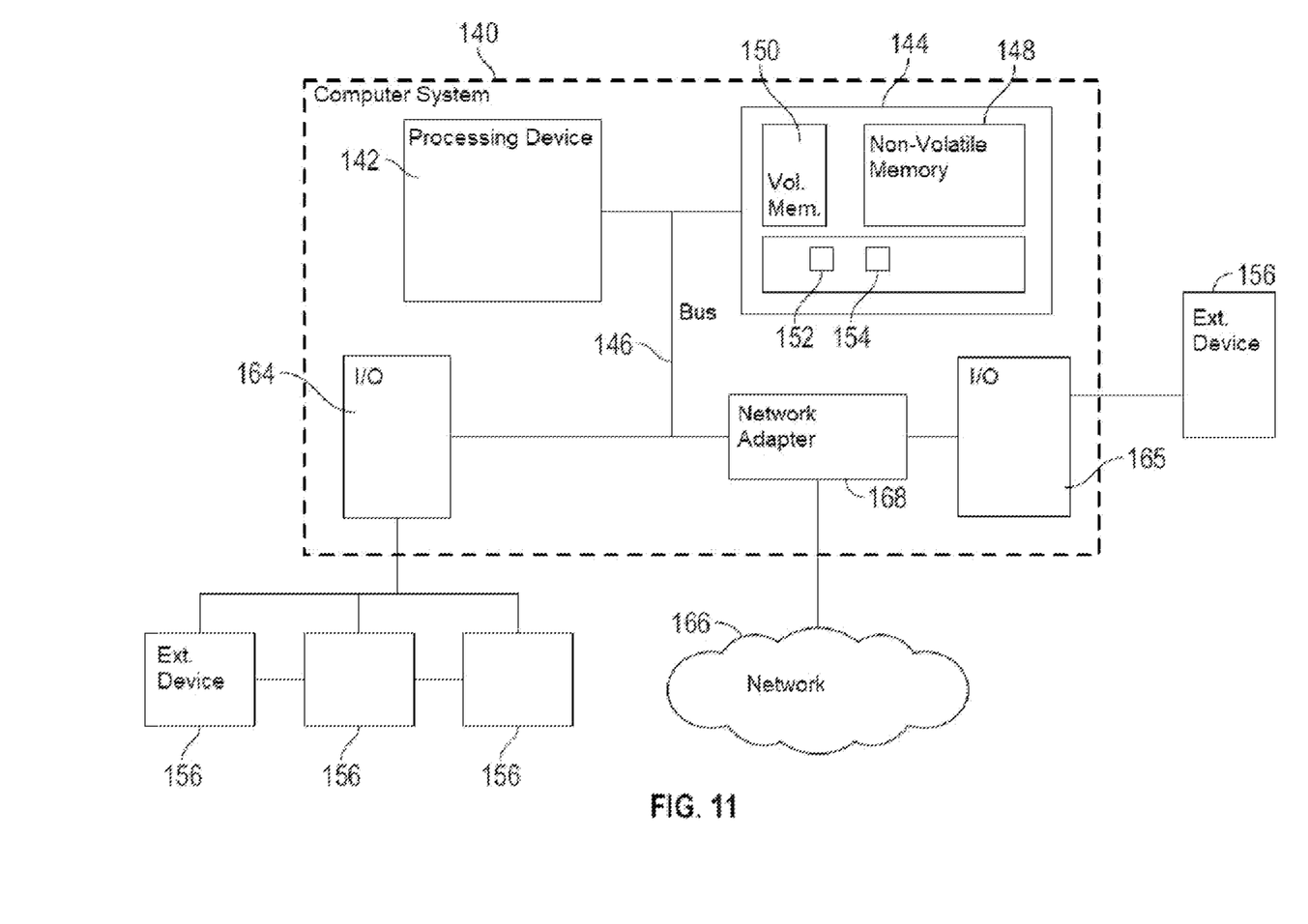
FIG. 11 depicts a computer system in accordance with an exemplary embodiment.

FIG. 11 illustrates aspects of an embodiment of a computer system 140 that can perform various aspects of embodiments described herein. The computer system 140 includes at least one processing device 142, which generally includes one or more processors for performing aspects of image acquisition and analysis methods described herein.

Components of the computer system 140 include the processing device 142 (such as one or more processors or processing units), a memory 144, and a bus 146 that couples various system components including the system memory 144 to the processing device 142. The system memory 144 may include a variety of computer system readable media. Such media can be any available media that is accessible by the processing device 142, and includes both volatile and non-volatile media, and removable and non-removable media.

For example, the system memory 144 includes a non-volatile memory 148 such as a hard drive, and may also include a volatile memory 150, such as random access memory (RAM) and/or cache memory. The computer system 140 can further include other removable/non-removable, volatile/non-volatile computer system storage media.

The system memory 144 can include at least one program product having a set (e.g., at least one) of program modules that are configured to carry out functions of the embodiments described herein. For example, the system memory 144 stores various program modules that generally carry out the functions and/or methodologies of embodiments described herein. A module or modules 152 may be included to perform functions related to acquiring images. An image analysis module 154 may be included for post-processing of images and/or comparison of images as described herein.

The system 140 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 142 can also communicate with one or more external devices 156 as a keyboard, a pointing device, and/or any devices (e.g., network card, modem, etc.) that enable the processing device 52 to communicate with one or more other computing devices. Communication with various devices can occur via Input/Output (I/O) interfaces 164 and 165.

The processing device 142 may also communicate with one or more networks 166 such as a local area network (LAN), a general wide area network (WAN), a bus network and/or a public network (e.g., the Internet) via a network adapter 168. It should be understood that although not shown, other hardware and/or software components may be used in conjunction with the computer system 40. Examples include, but are not limited to: microcode, device drivers, redundant processing units, external disk drive arrays, RAID systems, and data archival storage systems, etc.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system for evaluating a battery cell, comprising:
    a deformation assembly configured to elastically deform a tab of the battery cell between a first deformation state and a second deformation state, wherein the tab is elastically deformed to an extent configured to cause a detectable change in an actual physical discontinuity of the tab;
    an imaging device configured to take a first image of at least part of the battery cell when the battery cell is in the first deformation state, and take a second image of the at least part of the battery cell when the battery cell is in the second deformation state; and
    a processor configured to acquire the first image and the second image, the processor configured to perform:
    analyzing the first image and the second image, identifying a first region of the first image that represents a suspected discontinuity, the first region corresponding to a portion of the battery cell;
    comparing the first region of the first image to a second region of the second image, the second region corresponding to the portion of the battery cell; and
    determining that the suspected discontinuity is the actual physical discontinuity based on a difference between the first region and the second region.

2. The system of claim 1, wherein the imaging device is configured to take the first image and the second image using direct x-ray radiography.

3. The system of claim 1, wherein at least one of the first deformation state and the second deformation state is achieved by elastically deforming part of the battery cell further comprising a holding fixture configured to secure the battery cell in a stationary position, the deformation assembly including a support structure and a bending feature configured to apply a force to bend the tab.

4. The system of-claim 1, wherein at least one of the first deformation state and the second deformation state is achieved by bending the tab.

5. The system of claim 1, wherein the the actual discontinuity is a tear, and the change in the actual discontinuity is an expansion or a contraction of the tear.

6. The system of claim 5, wherein the portion of the battery cell includes at least one of: a foil of the battery cell, a foil stack of the battery cell, a weld region and a region including a weld line.

7. The system of claim 1, wherein analyzing the first image and the second image is performed to increase at least one of a contrast and a visibility of the suspected discontinuity.

8. The system of claim 7, wherein analyzing the first image and the second image includes performing at least one of digital filtering and histogram weighting.

9. The system of claim 1, wherein identifying the first region is based on an automated machine vision discontinuity detection process.

10. A method of evaluating a battery cell, comprising:
    taking a first image of at least part of the battery cell when the battery cell is in a first deformation state;
    elastically deforming a tab of the battery cell from the first deformation state to a second deformation state, wherein the tab is elastically deformed to an extent configured to cause a detectable change in an actual physical discontinuity of the tab;
    taking a second image of the at least part of the battery cell when the battery cell is in the second deformation state;
    analyzing the first image and the second image, identifying a first region of the first image that represents a suspected discontinuity, the first region corresponding to a portion of the battery cell;
    comparing the first region to a second region of the second image, the second region corresponding to the portion of the battery cell; and
    determining that the suspected discontinuity is the actual physical discontinuity based on a difference between the first region and the second region.

11. The method of claim 10, wherein the imaging device is configured to take the first image and the second image using direct x-ray radiography.

12. The method of claim 10, wherein at least one of the first deformation state and the second deformation state is achieved by elastically deforming part of the battery cell elastically deforming the tab includes securing the battery cell in a stationary position, and applying a force to bend the tab.

13. The method of claim 10, wherein the battery cell is a pouch-type battery cell.

14. The method of claim 13, wherein the second region also represents the suspected discontinuity, and comparing the first region to the second region includes comparing a geometry of the suspected discontinuity in the first region to a geometry of the suspected discontinuity in the second region.

15. The method of claim 10, wherein determining that the suspected discontinuity is an actual discontinuity is based on the suspected discontinuity being visible in the first region of the first image, and the suspected discontinuity being not visible in the second region of the second image.

16. The method of claim 10, wherein identifying the first region is based on an automated machine vision discontinuity detection process.

17. A computer program product comprising a computer readable storage medium, the computer readable storage medium having instructions executable by a computer processor to cause the computer processor to perform a method comprising:
- taking a first image of at least part of the battery cell when the battery cell is in a first deformation state;
- elastically deforming a tab of the battery cell from the first deformation state to a second deformation state, wherein the tab is elastically deformed to an extent configured to cause a detectable change in an actual physical discontinuity of the tab;
- taking a second image of the at least part of the battery cell when the battery cell is in the second deformation state;
- analyzing the first image and the second image, identifying a first region of the first image that represents a suspected discontinuity, the first region corresponding to a portion of the battery cell;
- comparing the first region to a second region of the second image, the second region corresponding to a portion of the battery cell; and
- determining that the suspected discontinuity is the actual physical discontinuity based on a difference between the first region and the second region.

18. The computer program product of claim 17, wherein at least one of the first deformation state and the second deformation state is achieved by bending the tab.

19. The computer program product of claim 17, wherein the battery cell is a pouch-type battery cell, and the portion of the battery cell includes at least one of: a foil of the battery cell, a foil stack of the battery cell, a weld region and a region including a weld line.

20. The computer program product of claim 17, wherein analyzing the first image and the second image is performed to increase at least one of a contrast and a visibility of the suspected discontinuity.

* * * * *